United States Patent
Schwartz et al.

[11] Patent Number: 6,086,728
[45] Date of Patent: Jul. 11, 2000

[54] CROSS FLOW METALIZING OF COMPACT DISCS

[76] Inventors: Vladimir Schwartz, 12 Revolutionary Rd., Lexington, Mass. 02173; Klaus Bierwagen, 197 Riverview Ave., Waltham, Mass. 02154

[21] Appl. No.: 08/478,187

[22] Filed: Jun. 7, 1995

Related U.S. Application Data

[63] Continuation-in-part of application No. 08/355,664, Dec. 14, 1994, Pat. No. 5,518,599.

[51] Int. Cl.⁷ .................................................. C23C 14/34
[52] U.S. Cl. ........................ 204/192.12; 204/298.15; 204/298.23; 204/298.25; 204/298.26; 204/298.28; 204/298.27
[58] Field of Search .............. 204/298.23, 298.25, 204/298.26, 298.27, 298.28, 298.15, 192.12; 118/719, 729, 730

[56] References Cited

U.S. PATENT DOCUMENTS

| | | | |
|---|---|---|---|
| 4,588,343 | 5/1986 | Garrett | 204/298.25 |
| 4,808,291 | 2/1989 | Denton et al. | 204/298.25 |
| 5,518,599 | 5/1996 | Schwartz et al. | 204/298.25 |

*Primary Examiner*—Rodney McDonald
*Attorney, Agent, or Firm*—Frommer Lawrence & Haug LLP

[57] ABSTRACT

A cross flow system for metalizing compact discs, capable of being interposed in-line in the production of the compact discs after premastering, mastering, electro-forming, and molding includes a vacuum chamber having diametrically opposed vacuum locks and multiple metalization sources in the form of magnetrons, with a preferred cross flow including the introduction of a disc to be metalized through one lock and the exit of the metalized disc through the diametrically opposite lock. The double vacuum lock diametrically opposed cross flow system eliminates the problems of throughput limitations, high rate deposition, substrate pitting, and software complexity due to indexing which makes prior systems both costly and inefficient. The system also permits processing of more than one substrate or compact disc title such that multiple titled compact discs can be processed simultaneously.

7 Claims, 5 Drawing Sheets ced to a
CROSS FLOW METALIZING OF COMPACT DISCS

This is a continuation-in-part of U.S. patent application Ser. No. 08/355,664, filed Dec. 14, 1994 now U.S. Pat. No. 5,518,599.

FIELD OF THE INVENTION

This invention relates generally to the fabrication of compact discs and more particularly to a cross flow metalization system for increasing yield and decreasing complexity while permitting in-line metalization in the compact disc fabrication process.

BACKGROUND OF THE INVENTION

Compact discs or CDs are currently manufactured in a relatively complex process in which the information on the CD is first obtained for instance from a digital source. A premastering disc is created in a photo lithographic process which lays down the information in a spiral pattern. From the premastering disc, a master stamping disc is formed in an electroplating process. The master stamping disc is then used to hot stamp thermoplastic discs with the grooves or interstices which carry the information from the premastering disc.

Following the molding of the discs, the discs are "metalized" by placing them, via a vacuum lock, into a vacuum chamber where a thin coat of aluminum is deposited over the physical patterning on the surface of the disc ("substrate") using a sputtering device comprising a magnetron. After metalization the discs are spin coated to cover the metal with a protective coating such as lacquer. This is usually followed by an inspection step.

Compact discs were originally fabricated in a batch process in which individual discs were taken from station-to-station. Present processing requires continuous processing along an efficient flow path to take the discs from start to finish, so that more than 1,000 discs per hour can be manufactured.

The metalization step has caused significant throughput and quality problems in the past. Initially, the metalizer was located off-line (i.e., out of the main, direct line process flow) due to its size and complexity. These units simply could not conveniently be located in the flow path, but rather had to be located off to one side with resultant materials handling problems and complexity.

Metalizers can now be made part of the flow path and are currently available from Leybold in Germany and Balzers in Liechtenstein. The standard metalizers from these companies are similar in design and throughput performance. Both have rotational transport mechanisms which use a dial inside of a vacuum chamber for the transportation of a plurality of substrates (e.g., thermoplastic discs) under a single deposition source which includes a magnetron. Adjoining the vacuum chambers are external rotational transport mechanisms for bringing the substrates (discs) in and out of the vacuum chamber through a single vacuum lock. Internal and external transport mechanisms sequentially carry out the loading and unloading of the substrates.

These metalizers have permitted increased throughput by providing continuous processing. However, the continuous process permits only one title to be run at one time through the molding, metalizing, spin coating, and inspection process. This makes the overall investment for CD manufacturing very high because one metalizing machine must be assigned to each molding system.

It will be appreciated that for compact disc production, orders for compact discs are frequently in the hundreds as opposed to thousands or tens of thousands. Thus, it is very important to be able to either process different titles simultaneously or increase throughput speed to maintain the efficiency of the entire line.

Throughput speed is frequently increased by decreasing the dwell time under the sputtering device. This is accomplished by moving the magnetron closer to the substrate. However, this approach decreases overall quality of the disc and can render high density information discs unusable.

A different approach to increasing throughput speed and also permitting the simultaneous processing of multiple titles, has been developed by Leybold—a double magnetron, double vacuum lock system. Theoretically, this approach should increase disc throughput twofold. However, these machines require the disc to exit to the same vacuum lock it entered resulting in an inordinate amount of indexing complexity which significantly diminishes the theoretical increase.

Leybold's double lock machines have exceedingly large diameter dials, often greater than five feet. The sheer size of the vacuum deposition chamber to accommodate such large dials inhibits the insertion of this machine into the production line, to say nothing of the cost of the relatively large unit. With the use of this device a complicated process flow path is thus, inevitable.

The double magnetron machines also require a double index step in which "odd numbered" discs are processed by one magnetron and "even numbered" discs are processed by the second magnetron. However, with these machines, both discs must pass under both magnetrons. It will be appreciated that with this approach, indexing errors rapidly become significant. When such errors occur during the processing of multiple CD titles, the titles become mixed up such that all of the mixed up discs must be discarded, as there is no way of identifying which disc was associated with which title.

More particularly, when multiple titles are to be processed, the discs of a single title are loaded onto discrete spindles, with an average of six spindles being utilized during a run. These spindles each typically hold as many as 200 CDs. If during the process indexing problems occur, then the entire lot may have to be discarded because the manufacturer must guarantee that the discs loaded on a given spindle come out with the same titles.

Thus while the double magnetron, double vacuum lock system permits processing of multiple titles simultaneously, the potential indexing problems are so severe that such processing is generally not practical There is therefore a necessity for providing an in-line system with efficient metalizing in which indexing problems are reduced to a minimum while at the same time being able to process multiple titles, to accommodate short production runs.

SUMMARY OF THE INVENTION

The present invention is an improved metalizer which, rather than employing a single vacuum lock, single magnetron system or a multiple magnetron system with each vacuum lock handling the same disc on entry and exit, is directed to a system in which the vacuum locks through which discs are introduced into the vacuum chamber are different from the vacuum locks through which the discs exit the vacuum chamber. This approach permits not only the creation of a smaller metalizer which is capable of being interposed in a linear process flow path, but also eliminates the interleaving of discs during the metalization process and the associated, inevitable indexing problems. In one embodiment the present invention permits the use of a dial having as few as four disc carriers within the vacuum chamber, versus the utilization of a more than twelve disc carrier dial within a vacuum chamber for a Leybold double magnetron metalizer.

In a preferred embodiment of the present invention the vacuum locks are diametrically opposed to each other on either side of the dial. Moreover, the magnetrons utilized to metalize the discs are also diametrically opposed to each other on opposite sides of the dial such that the flow of a disc from input lock to exit lock requires that the disc travel under only one magnetron. For purposes of carrying out the invention, the magnetrons need not be diametrically opposed but rather need only be on different sides of the dial. While it is preferable to have the input and exit locks diametrically opposed to be able to most efficiently operate with a linear flow of product, the vacuum locks may be offset one from the other as required. It should be noted, however, that a non-diametric arrangement of the input and exit locks expands the overall size of the equipment.

In operation, a disc having a first title enters the vacuum chamber from a first lock, is moved around the dial, is metalized, and exits at a second lock preferably located opposite the first lock. A second title enters the vacuum chamber via the second lock and is moved around with the dial in the opposite direction, horizontally speaking, from the direction of movement of the first-title, to produce a "cross flow". After metalizing, the second title exits the vacuum chamber via the first lock. Thus, the flow of product in one direction is for one title, while the flow of product in the other direction is for the second title. This flow pattern guarantees title integrity as all product emerging from a given lock must be associated with one title. Thus, the present invention provides title integrity while also providing a substantially higher throughput with a better economy of machinery.

With the improved throughput, standard deposition rate sources may be employed at either increased spacing between the magnetron and the disc or at lower electric consumption rates to prevent pitting. Thus, one and a half times the production rate achievable with prior machines can be achieved without compromising product quality.

Additionally, if a single magnetron metalizer is made in accordance with the present invention it can be instantly ungraded in the field simply by adding a second magnetron at a second position. This is not possible with the majority of present metalizers since they have only a single vacuum lock, and would thus, have to be remanufactured to provide a second vacuum lock.

In summary, a cross flow system for metalizing compact discs, capable of being interposed in-line in the production of the CDs after premastering, mastering, electro-forming, and molding preferably includes diametrically opposed vacuum locks for a vacuum chamber and multiple metalization sources in the form of magnetrons, with a cross flow including, the introduction of a disc to be metalized through one lock and the exit of the metalized disc preferably through a diametrically opposite lock. The double vacuum lock, diametrically opposed cross flow system eliminates the problems of throughput limitations, high rate deposition, substrate pitting, and indexing software complexity which makes prior systems both costly and inefficient. The system also permits processing of more than one substrate or CD title such that multiple CD titles can be processed simultaneously.

BRIEF DESCRIPTION OF THE DRAWINGS

These and other features of the subject invention will be better understood in conjunction with the Detailed Description taken in conjunction with the Drawings of which.

DETAILED DESCRIPTION

Figure 1B:
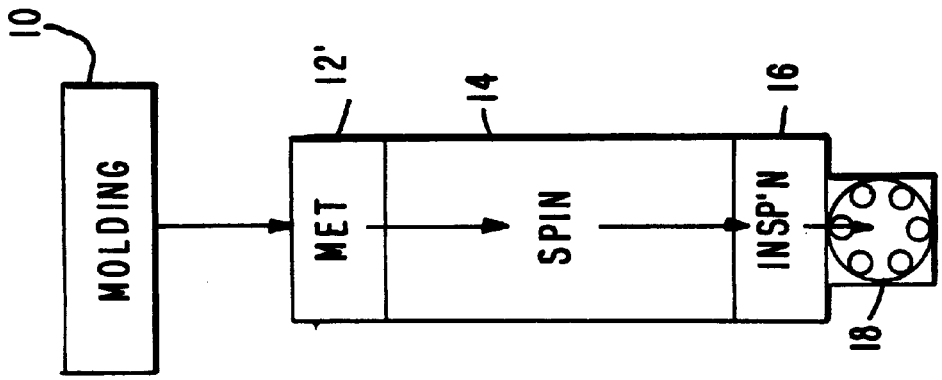
FIG. 1B is a schematic and diagrammatic illustration of a process for the fabrication of compact discs having an inline flow path including an in-line metalizer.
Figure 1A:
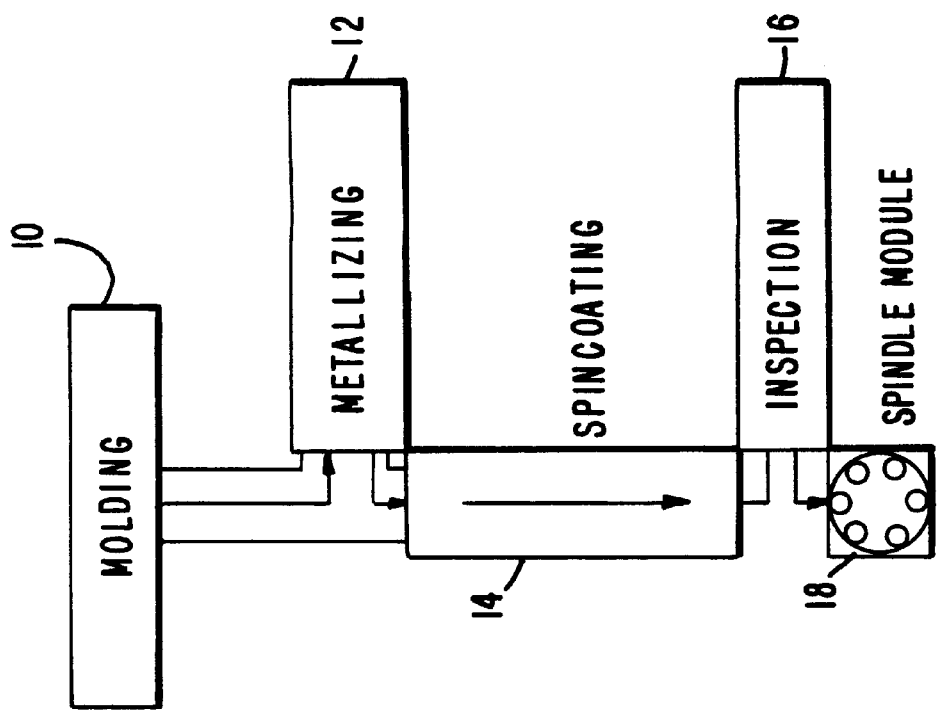
FIG. 1A is a schematic and block diagram of a prior art line for the production of compact discs.

Referring now to FIG. 1A, after a premastering step produces a master of the particular program material or content of the disc and after electroplating, the master provides a hot stamping, embossing, or stamping plate, used in the molding of an individual disc as illustrated at 10. This step is followed in the prior art with off-line metalization accomplished through a metalizer 12. After metalization of the disc, the disc is spin coated at 14 and inspected at 16 which returns the completed disc to a spindle module 18 where it is available for printing and packaging.

It will be appreciated that in the flow process illustrated in FIG. 1A, the metalizer is located off-line due to its single port configuration. By off-line it is meant that the metalizer is not serviced by the main conveyor used to transport the molded disc through the system.

In contradistinction as shown in FIG. 1B, a metalizer 12' is located in-line with the flow of product from the molding station through the metalization station to the spin coating station. With current technology, the inspection station can also be brought in-line with the spin coating station and the spindle module.

Figure 2A:
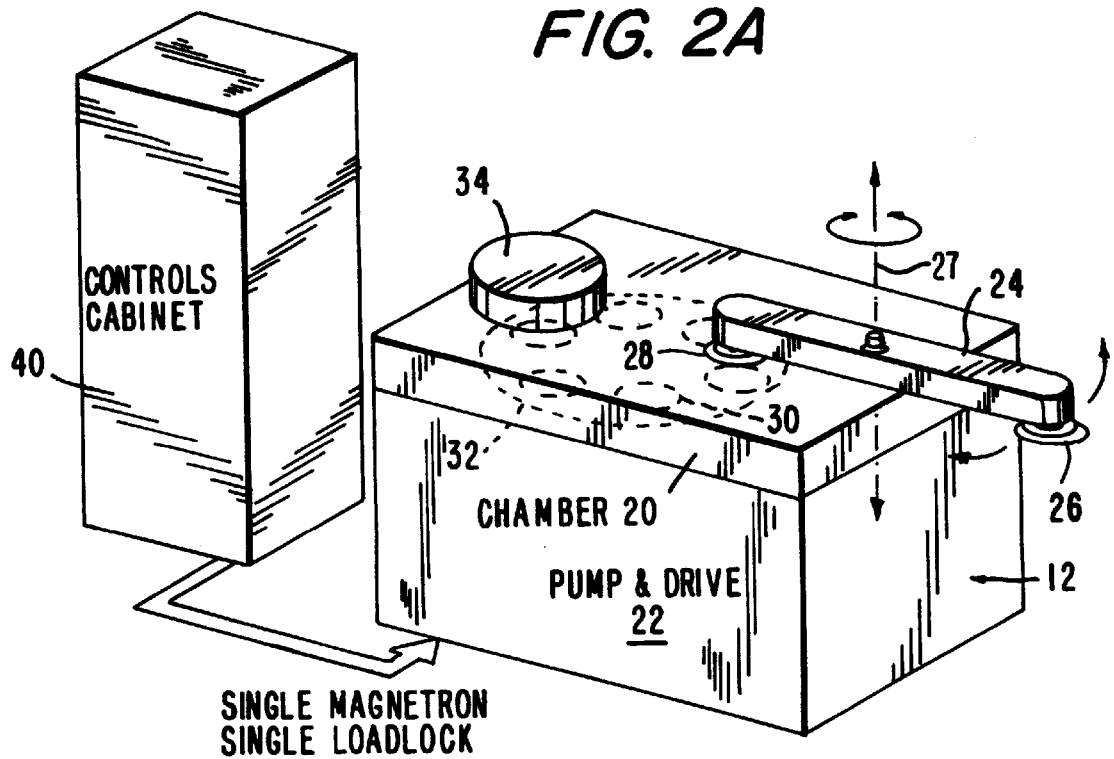
FIG. 2A is a diagrammatic illustration of a prior art metalization chamber utilizing a single magnetron and a single vacuum lock.
Figure 2B:
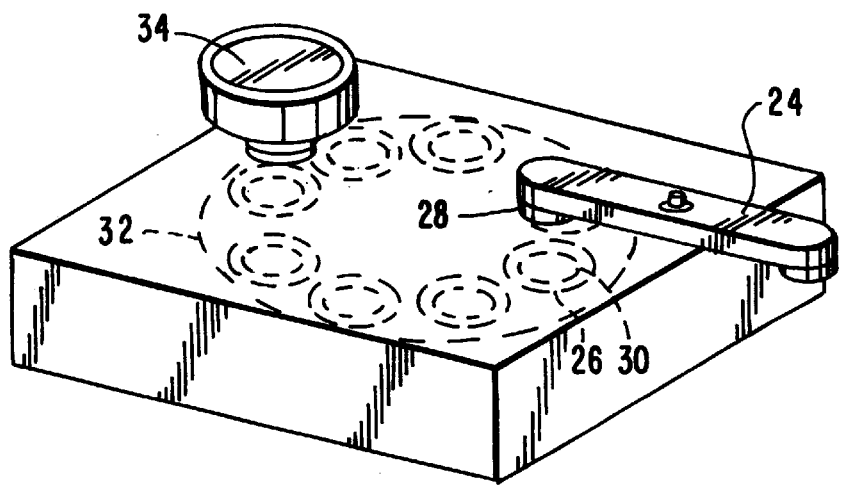
FIG. 2B is a diagrammatic illustration of the prior art single chamber, single vacuum lock metalization unit described in connection with FIG. 2A.

Referring to FIG. 2A, a prior art metalizer 12 as shown schematically in FIG. 1A, includes a chamber 20, located above a pump and drive housing 22 directed by a microprocessor housed in controls cabinet 40. A vacuum lock manipulator 24, picks up discs 26, after they have exited the molding apparatus 10. The manipulator rotates and moves up and down in a vertical plane to bring the unmetalized discs to the entrance to the single vacuum lock of the chamber. The discs are brought into the chamber and placed in a substrate holder 30 within a dial 32 which rotates the discs under a metalizing unit in the form of a magnetron 34. The features of this prior art metalizer are shown in more detail in FIG. 2B. in which disc 26 is located within substrate holder 30 located within dial 32, with like reference characters referring to like elements between these two figures.

Figure 3:
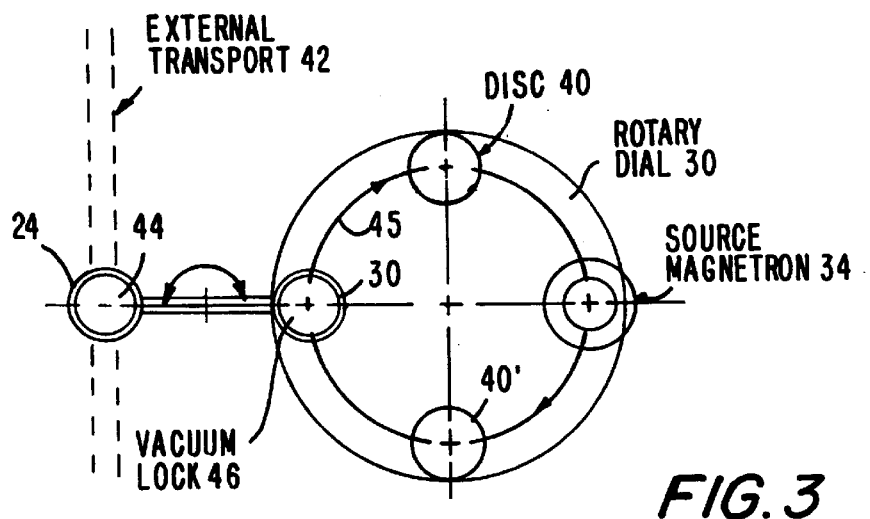
FIG. 3 is a diagrammatic top view of the prior art single port, single magnetron metalization unit.

Referring to FIG. 3, such single magnetron, single vacuum lock machines are connected to an external transport 42 from which the manipulator 24 obtains a disc 44. The manipulator 24 places the disc 44 through vacuum lock 46 into the substrate holder 30 positioned at the vacuum lock. Disc 44 is revolved around in the direction of arrow 45 via movement of rotary dial 30 until it is positioned underneath magnetron 34. At this point the metalization of the surface of the disc is accomplished. The disc is then moved back towards vacuum lock 46.

Figure 4:
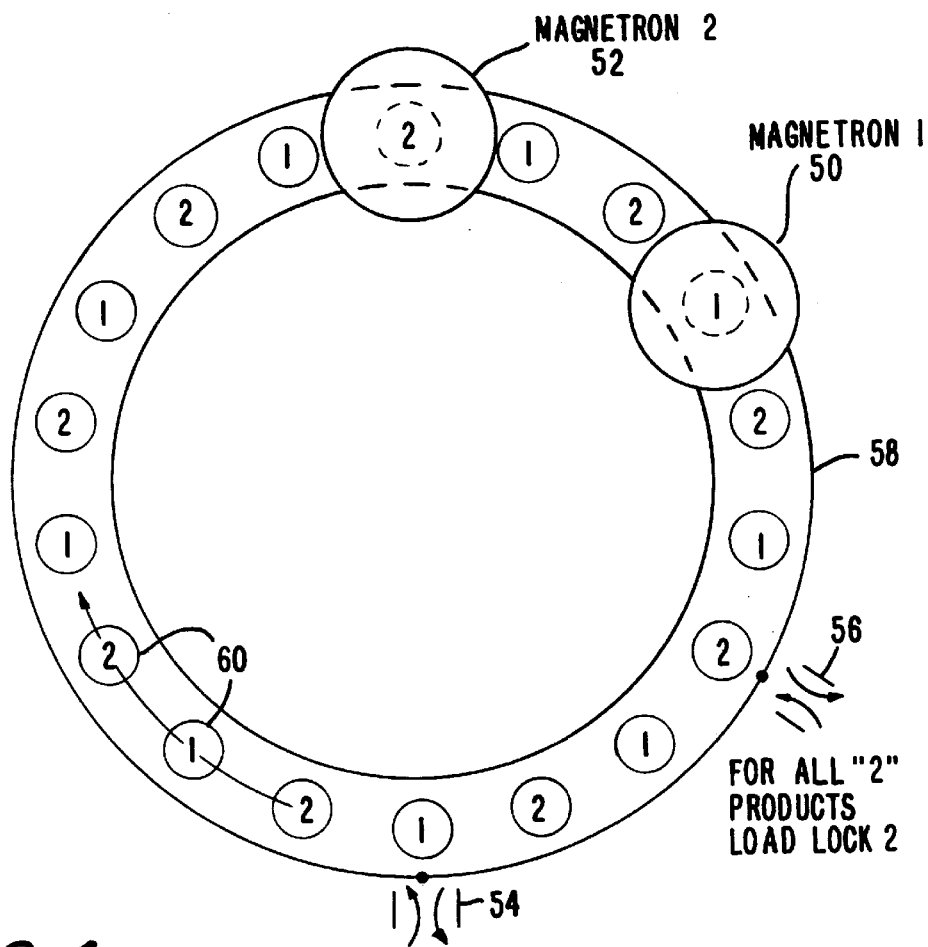
FIG. 4 is a diagrammatic and top view of a prior art multi-port, multi-magnetron system in which compact discs enter and exit the same vacuum lock.

A two magnetron, two vacuum lock metalizer is shown in FIG. 4. These metalizers also include a rotary dial 58 which, is upwards of 5 feet in diameter with 24 substrate holders 60 which are divided for ease of reference into odd and even numbered substrate holders.

In operation, discs of the first title, here labeled "1" are loaded into the vacuum chamber (not shown) at vacuum lock 54, where they are placed in the substrate holder currently at that position. The second title, here labeled title "2", is loaded through vacuum lock 56 into a substrate holder designated with an even number. By use of an indexing system (not shown), the discs are positioned under one or the other magnetron, so that magnetron 52 metalizes only the second title and magnetron 50 metalizes only the first title. This indexing pattern also causes the first and second titles to exit through the same vacuum lock each respectively entered. As noted above, when indexing problems occur with this system, all of the discs in the run have to be discarded.

Figure 5:
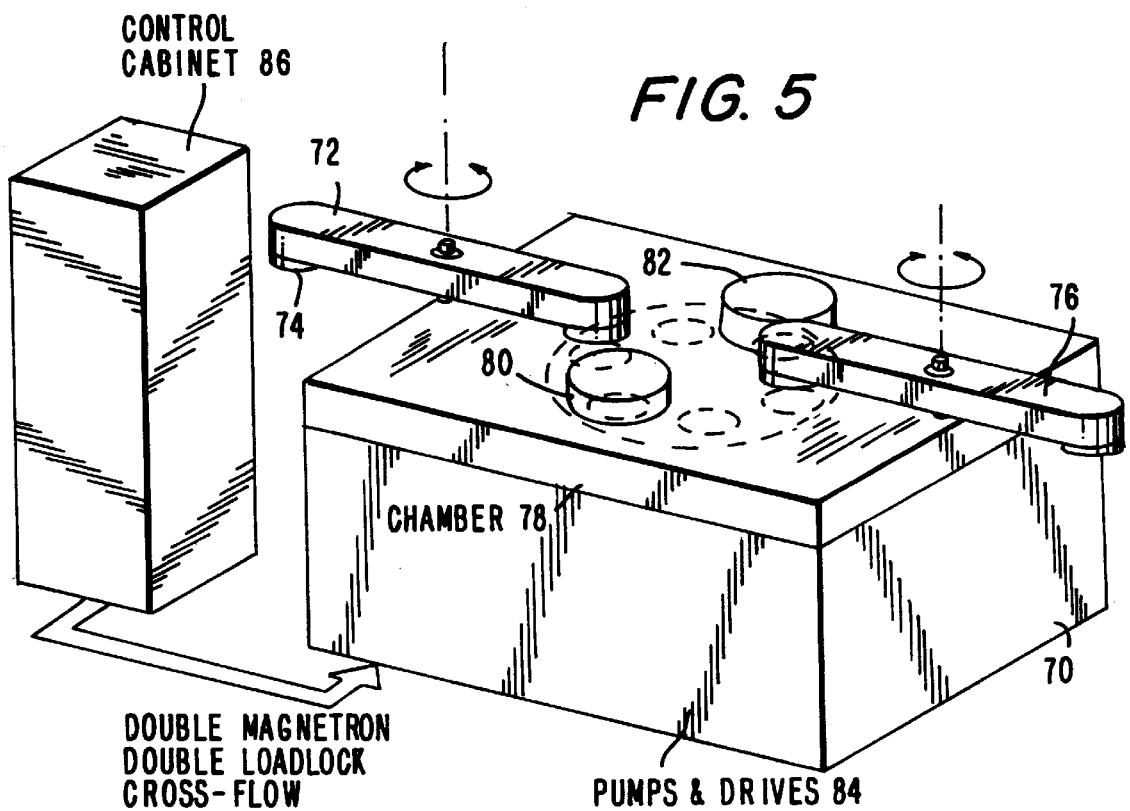
FIG. 5 is a diagrammatic representation of the subject metalizing system utilizing diametrically opposed vacuum locks used for loading and unloading discs and double magnetron metalization stations within a vacuum chamber to implement cross flow processing.
Figure 7:
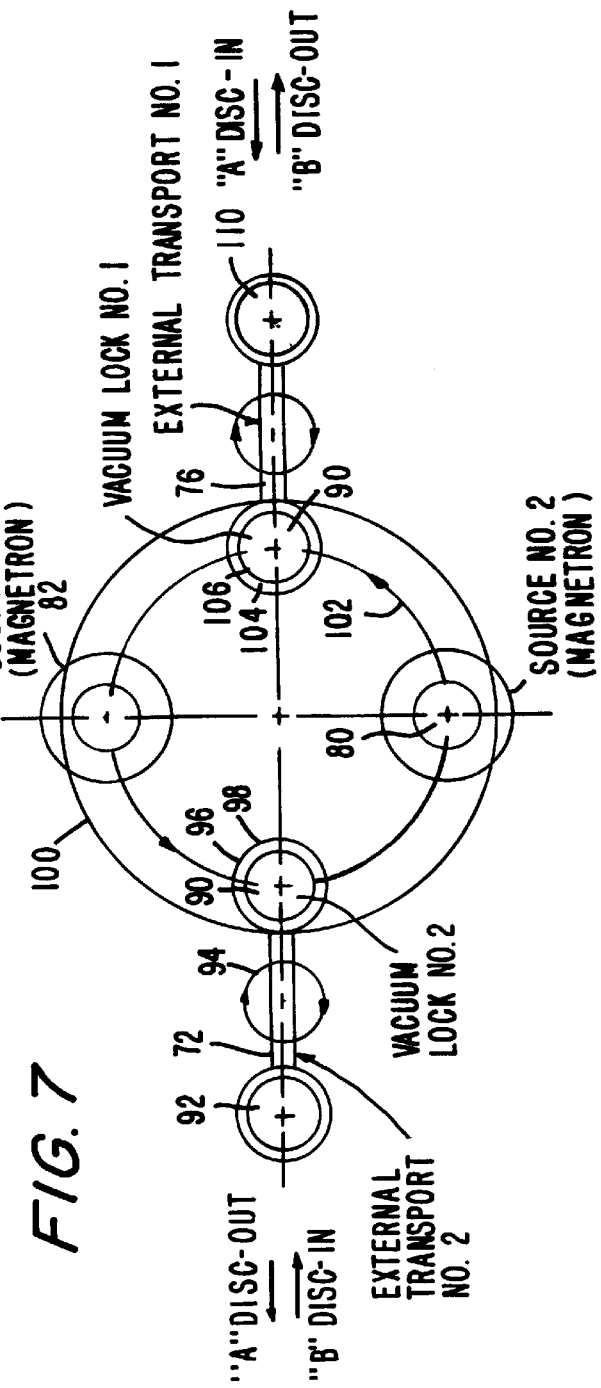
FIG. 7 is a top schematic view of the subject metalization unit illustration diametrically opposed input and exit vacuum locks and multiple magnetrons, also illustrating a cross flow system for product flow through the vacuum chamber.

Referring now to FIGS. 5 and 7, unlike the prior art systems, the metalization unit 70 of the present invention is interposed in the line in which load lock manipulators 72 and 76 can each receive incoming discs 74 from a molding apparatus.

Figure 6:
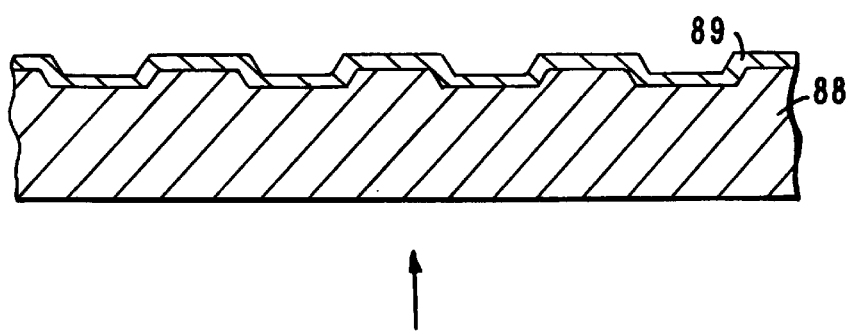
FIG. 6 is a cross sectional view of a portion of a compact disc which has been metalized in accordance with the subject invention.

The load lock manipulators 72 and 76 each bring their respective newly molded disks to an aperture above a vacuum lock—aperture 96 and vacuum lock 98 for manipulator 72 and aperture 104 and vacuum lock 106 for manipulator 76—for entry into the vacuum chamber 78. Discs entering through vacuum lock 106 ("A" discs), move around the "top" of the arc defined by the dial 100 (as shown in FIG. 7), passing under magnetron 82. After being metalized via magnetron 83 (the end result of which is shown in FIG. 6 where the metal coating is designated 89 and the substrate is 88) these discs are passed out of the vacuum chamber 78 through vacuum lock 98 where they are picked up by manipulator 72. Conversely, discs which enter vacuum chamber 78 via vacuum lock 98 ("B" discs), pass along the "bottom" of the arc under magnetron 80 and exit via vacuum lock 106. This procedure and configuration thus, substantially reduce indexing complexity and the likelihood of indexing errors.

In one preferred embodiment of the present invention Disc "A" and Disc "B" are the same title being metalized via a cross flow pattern. In another embodiment, Disc "A" and Disc "B" represent different titles being simultaneously metalized and flowing in and out of the metalizer in different directions (i.e., in the cross flow pattern).

In yet another preferred embodiment of the present invention, the second magnetron 80 is eliminated and the disc flow is only along the "top" of the arc of dial 100. Obviously, such a configuration lends itself to the simple addition of second magnetron 80 at a later time.

In still further embodiments of the present invention, the size of the dial 100 can be expanded to include more substrate holders to provide space for additional vacuum locks, manipulators and magnetrons. In other words, but for space considerations and manipulator interference, an unlimited number of vacuum locks and magnetrons, in pairs, can be employed to increase processing throughput and title handling. For example, adding one more magnetron and one more vacuum lock could allow the present invention to simultaneously process three titles. It will be appreciated by one of skill in the art however, that these additions can significantly complicate flow paths and materials handling to the point where no useful gain is realized.

Figure 8:
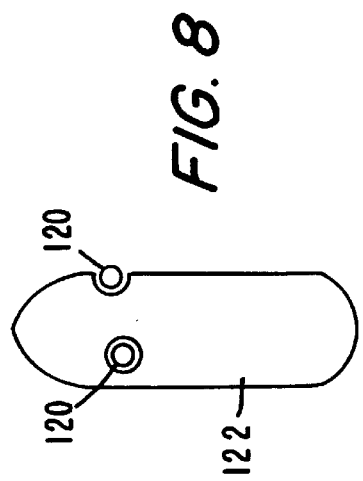
FIG. 8 is a perspective view of the substrate lock of the present invention.

A further feature of the present invention is shown in FIG. 8. That is, the presence of a substrate lock 120 associated with a centering pin 122 used in conjunction with the substrate holder. The centering pin 122 is used with prior art devices to precisely locate the substrate in the substrate holder. However, because of the rotational speeds of the dial 100 possible with the present invention, the substrates could become disengaged from the substrate holder. As such, the provision of substrate lock 120, preferably in the form of spring biased steel balls, provides the ability to maintain the precision placement of the substrate in the substrate holder, throughout the substrate's travel through the vacuum chamber.

What has been achieved is a materials handling system which significantly improves the quality and speed with which compact discs or other articles can be manipulated through a vacuum chamber in a cross flow process in which, in a preferred embodiment, entrance and exit locks are diametrically opposed. The system is not only capable of handling compact discs which must be metalized but is also useful in semi-conductor processing in which various other substrates such as semiconductor wafers, ceramics, plastics and metals can be metalized via vacuum deposition or otherwise processed via the cross flow.

While reference has been made to certain preferred embodiments of the present invention, these are meant as illustrative only and it will occur to those skilled in the art that modifications can be made without departing from the spirit or intent of the invention.

What is claimed is:

1. A method of metalizing substrates comprising:

providing a supply of substrates;

introducing substrates to a vacuum chamber through a first vacuum lock;

passing said substrates under sputtering means to metalize said substrate;

removing said metalized substrates from said vacuum chamber via a second vacuum lock; and adding a second sputtering means such that:
  substrates are introduced to said vacuum chamber via said second vacuum lock:
  substrates introduced via said second vacuum lock pass under said second sputtering means; and
  substrates metalized by said second sputtering means exit said chamber via said first vacuum lock.

2. A method of metalizing substrates comprising:

providing a supply of substrates;

introducing substrates to a vacuum chamber through a first vacuum lock;

introducing substrates to said vacuum chamber through a second vacuum lock;

passing substrates introduced to said vacuum chamber via said first vacuum lock under first sputtering means to metalize said substrates;

passing substrates introduced to said vacuum chamber via said second vacuum lock under second sputtering means to metalize said substrates;

removing said substrates metalized by said first sputtering means via said second vacuum lock; and removing said substrates metalized by said second sputtering means via said first vacuum lock.

3. A method according to claim 2, wherein said supply of substrates comprises at least first and second substrates kept separate by said method.

4. A method according to claim 3, wherein all said first substrates are introduced to said vacuum chamber via said first vacuum lock.

5. A method according to claim 4, wherein all said second substrates are introduced to said vacuum chamber via said second vacuum lock.

6. A method according to claim 5, wherein said first substrates travel in a first linear direction through said chamber and said second substrates travel in a second linear direction through said chamber.

7. A method according to claim 6, further comprising the step of maintaining the substrates in position in said vacuum chamber through use of locking means associated with a centering pin used to position said substrates during movement of said substrates between said vacuum locks.

* * * * *